US012600620B2

(12) United States Patent
Partanen

(10) Patent No.: US 12,600,620 B2
(45) Date of Patent: Apr. 14, 2026

(54) LOW-IMPACT OUT-OF-PLANE MOTION LIMITER MEMS DEVICE

(71) Applicant: Murata Manufacturing Co., Ltd., Nagaokakyo (JP)

(72) Inventor: Mikko Partanen, Vantaa (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 556 days.

(21) Appl. No.: 18/159,379

(22) Filed: Jan. 25, 2023

(65) Prior Publication Data

US 2023/0234834 A1     Jul. 27, 2023

(30) Foreign Application Priority Data

Jan. 25, 2022     (FI) ..................................... 20225060

(51) Int. Cl.
B81B 3/00            (2006.01)
(52) U.S. Cl.
CPC ...... B81B 3/0072 (2013.01); *B81B 2201/034* (2013.01); *B81B 2203/0154* (2013.01); *B81B 2207/11* (2013.01)
(58) Field of Classification Search
CPC ................ B81B 7/0016; B81B 3/0072; B81B 2203/0163; B81B 3/0051; B81B 2203/053; B81B 2203/058
See application file for complete search history.

(56) References Cited

U.S. PATENT DOCUMENTS

| | | | | |
|---|---|---|---|---|
| 9,061,895 B2 * | 6/2015 | Robert | ................. | B81B 3/0051 |
| 2002/0149071 A1 * | 10/2002 | Shim | .................... | B81B 3/0013 |
| | | | | 257/415 |
| 2004/0061962 A1 * | 4/2004 | Kwon | .................. | B81B 7/0016 |
| | | | | 359/876 |
| 2004/0255675 A1 | 12/2004 | Selvakumar et al. | | |
| 2012/0216616 A1 * | 8/2012 | Schultz | ................ | G01P 15/125 |
| | | | | 73/514.01 |
| 2018/0230005 A1 | 8/2018 | Lee et al. | | |

OTHER PUBLICATIONS

Asanuma, H. et al.; "Nonlinear restoring force of spring with stopper for ferroelectric dipole electret-based electrostatic vibration energy harvesters"; AIP Advances, 2016, vol. 6, Art. No. 075206 (9 pages).

* cited by examiner

*Primary Examiner* — Moazzam Hossain
(74) *Attorney, Agent, or Firm* — ArentFox Schiff LLP

(57)            ABSTRACT

A microelectromechanical device is provided that includes a mobile rotor and a fixed stator in a device plane. Moreover, a fixed wall defines a wall plane that is adjacent to the device plane and a motion limiter is provided to prevent the rotor from coming into direct physical contact with the fixed wall. The motion limiter includes a shock absorber that extends from the rotor to the stator and a fixed stopper structure that protrudes from the fixed wall toward the shock absorber.

22 Claims, 4 Drawing Sheets

LOW-IMPACT OUT-OF-PLANE MOTION LIMITER MEMS DEVICE

CROSS REFERENCE TO RELATED APPLICATIONS

This application claims priority to Finnish Patent Application No. 20225060, filed Jan. 25, 2022, the entire contents of which are hereby incorporated by reference in its entirety.

FIELD OF THE DISCLOSURE

This disclosure relates to microelectromechanical (MEMS) devices, and particularly to motion limiters which prevent undesired contact between mobile and stationary device parts.

BACKGROUND

In general, microelectromechanical (MEMS) devices, such as accelerometers and gyroscopes, often comprise a mass element that is suspended from fixed anchors with a flexible suspension structure that allows the mass element to move in relation to adjacent fixed structures. The mobile mass element may be called a rotor and a fixed device part where the anchors are located may be called a stator. The fixed structures adjacent to the rotor also usually include walls which form an enclosure around the rotor and other active parts of the MEMS device.

Direct physical contact between the rotor and fixed structures is usually not desirable because it may disturb the operation of the device. Although the rotor and its suspension structure can be dimensioned so that direct contact does not occur in regular operation, exceptional external shocks may still displace the rotor so much that it comes into direct contact with fixed structures, causing structural damage, stiction, electrical short-circuits or other faults.

Motion limiters can be implemented in MEMS devices to reduce or prevent these harmful consequences. In some implementations, a motion limiter can, for example, include a bump that is attached to the rotor and extends from the rotor towards an adjacent fixed structure. The gap between the motion limiter bump and the fixed structure may be narrow in the expected direction of motion, so that the bump will be the first part which comes into contact with the fixed structure in the event of an external shock. Damage can be reduced for example by placing a motion limiter bump as far away from the most sensitive areas of the rotor as possible.

However, the space which is available for motion limiters is usually limited by cost and design considerations. Furthermore, a general problem with a motion limiter bump rigidly fixed to a rotor is that the bump and the rotor always move together. If the impact between the bump and the fixed structure is hard, particles can be released particles from the fixed structure or from the bump itself. These particles can move toward the more sensitive regions of the device, limit the dynamical operation range and cause short-circuiting or other damage.

SUMMARY OF THE INVENTION

Accordingly, it is an object of the present disclosure to provide an apparatus that overcomes the problems mentioned above.

In an exemplary embodiment, a microelectromechanical device is provided that includes a mobile rotor that lies in a horizontal device plane in a rest position; a fixed stator adjacent to the mobile rotor, such that an edge of the mobile rotor is separated from an edge of the stator by a rotor-stator gap; a fixed wall that defines a wall plane that is adjacent to the horizontal device plane and separated from the horizontal device plane in a vertical direction by a rotor-wall gap, with the vertical direction being perpendicular to the horizontal device plane; and a motion limiter that is configured to prevent the mobile rotor from coming into direct physical contact with the fixed wall across the rotor-wall gap. Moreover, in this aspect, the motion limiter includes a shock absorber that extends from the mobile rotor to the fixed stator across the rotor-stator gap, and a fixed stopper structure that protrudes from the fixed wall in the vertical direction towards the shock absorber, so that fixed stopper structure is vertically aligned with the shock absorber in an impact region, and the shock absorber is separated from the fixed stopper structure in the vertical direction by a stopper gap. The fixed stopper structure is dimensioned so that when the mobile rotor undergoes motion in the vertical direction towards the fixed wall, the shock absorber is configured to contact the fixed stopper structure in the impact region before the mobile rotor contacts the fixed wall across the rotor-wall gap. Moreover, the shock absorber includes an impact part that is aligned with the fixed stopper structure in the vertical direction, one or more first shock absorber springs extending from the mobile rotor to the impact part, and one or more second shock absorber springs extending from the impact part to the fixed stator.

In another exemplary aspect of the microelectromechanical device, the shock absorber is flexible in the vertical direction.

In another exemplary aspect of the microelectromechanical device, the one or more first shock absorber springs and the one or more second shock absorber springs are flexible in the vertical direction.

In another exemplary aspect of the microelectromechanical device, the one or more first shock absorber springs comprise a single first shock absorber spring, and the one or more second shock absorber springs comprise a single second shock absorber spring.

In another exemplary aspect of the microelectromechanical device, the single first shock absorber spring comprises a first torsion bar attached to the mobile rotor, a second torsion bar attached to the impact part and a first connecting lever that extends between the first torsion bar and the second torsion bar, and the single second shock absorber spring comprises a third torsion bar attached to the impact part, a fourth torsion bar attached to the fixed stator and a second connecting lever that extends between the third torsion bar and the fourth torsion bar.

In another exemplary aspect of the microelectromechanical device, the single first shock absorber spring comprises a meandering shape in the device plane, and the single second shock absorber spring comprises a meandering shape in the device plane.

In another exemplary aspect of the microelectromechanical device, the one or more first shock absorber springs comprises dimensions that are substantially equal to respective dimensions of the one or more second shock absorber springs.

In another exemplary aspect of the microelectromechanical device, the one or more first shock absorber springs comprise a pair of first shock absorber springs attached to opposite ends of the impact part, and the one or more second shock absorber springs comprise a pair of second shock absorber springs attached to opposite ends of the impact part. Moreover, in a refinement of this aspect, each of the pair of first absorbers springs comprises a first torsion bar attached to the mobile rotor, a second torsion bar attached to the impact part and a first connecting lever extending between the first torsion bar and the second torsion bar, and each of the pair of second shock absorber springs comprises a third torsion bar attached to the impact part, a fourth torsion bar attached to the fixed stator and a second connecting lever extending between the third torsion bar and the fourth torsion bar.

In a further aspect, each of the pair of first shock absorber spring and each of the pair of second shock absorber spring are substantially equal to one another, respectively.

In another exemplary aspect of the microelectromechanical device, the shock absorber comprises a thickness in the vertical direction that is less than a thickness of the mobile rotor in the thickness direction.

According to exemplary aspects, the disclosed invention is based on the premise of building a motion limiter on a flexible spring that extends from the rotor to the stator. An advantage of this arrangement is that impact between the motion limiter and an adjacent fixed structure can be softened.

BRIEF DESCRIPTION OF THE DRAWINGS

In the following the disclosure will be described in greater detail by exemplary embodiments with reference to the accompanying drawings.

DETAILED DESCRIPTION

Figures 1A, 1B:
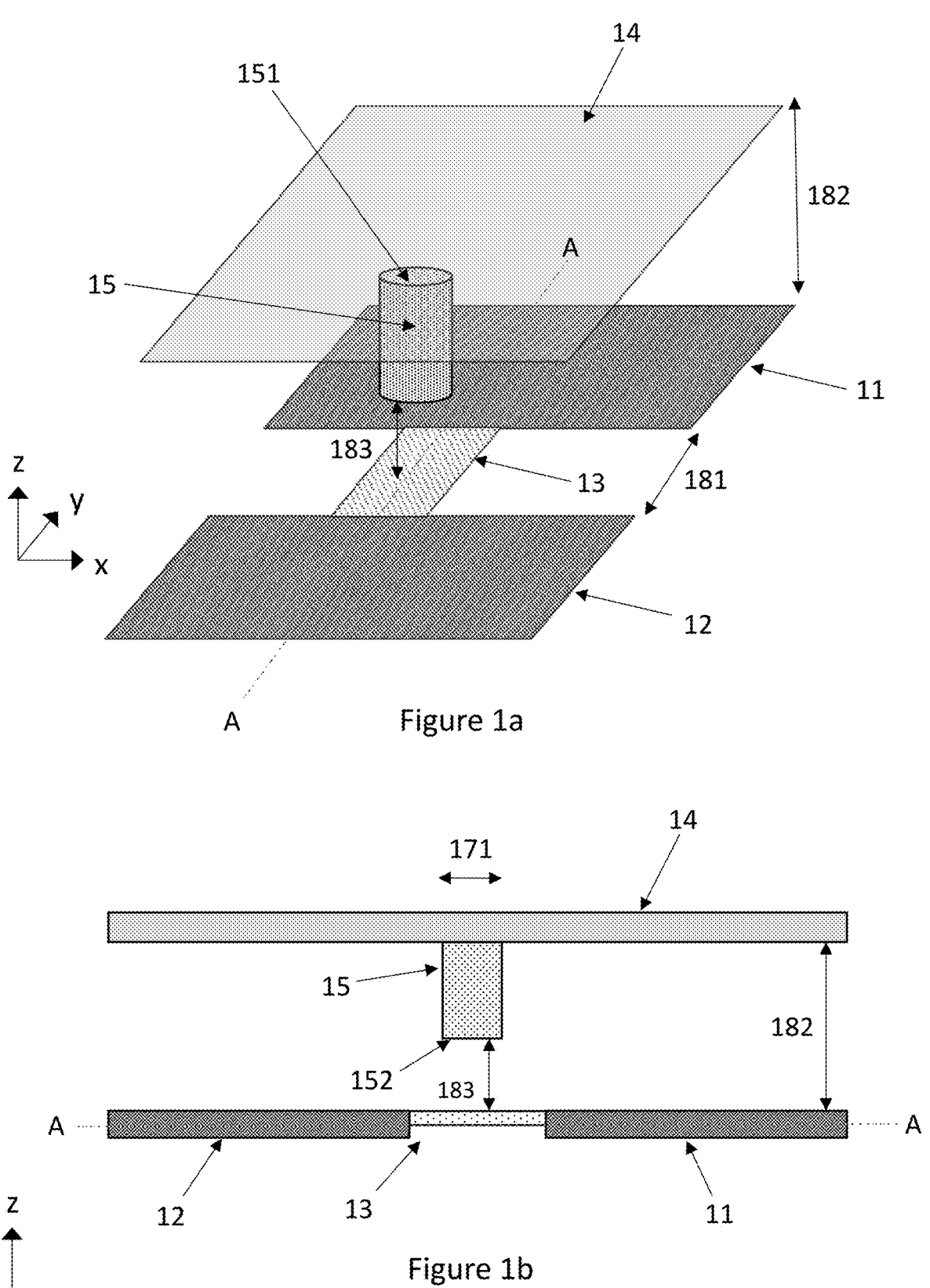
FIGS. 1a to 1d illustrate a motion limiter according to an exemplary aspect.

A rotor in a MEMS device is typically formed in a device layer, for example, by etching the device layer. In an exemplary aspect, the device layer can be a silicon wafer, for example. Alternatively, the device layer can be a layer of silicon which has been deposited on a substrate. The rotor is partially released from surrounding fixed structures when the device is manufactured. It may, for example, be suspended by flexible suspenders from fixed anchor points. Moreover, the suspenders may be formed in the same etching process as the rotor, and the regions of the fixed structure where the anchor points are located may be regions of the device layer which are adjacent to the rotor.

A stator that is adjacent to the rotor in a MEMS device may be any part of the device layer which, unlike the rotor, remains fixed to a given position with respect to surrounding fixed structures regardless of the movement experienced by the device. The stator may be used as a fixed reference point in a measurement that tracks the movement of the rotor, for example, in a capacitive measurement arrangement where a set of electrodes is prepared on the stator and a set of adjacent counter-electrodes is prepared on the rotor. In addition, a piezoelectric measurement arrangement can be alternatively prepared on a flexible suspender that extends from the stator to the rotor. However, the fixed stator, which is used for the purpose of building the motion limiter described in this disclosure, does not necessarily have to be the same structure used for measuring the movement of the rotor. Two separate stator structures could instead by used for these two purposes in alternative aspects.

According to an exemplary aspect, the device layer defines a device plane, which is illustrated as the xy-plane in this disclosure. The x-direction may be called the lateral direction, and the y-direction may be called the transversal direction for purposes of this disclosure. The device plane may also be referred to as the horizontal plane. A direction perpendicular to the device plane is in this disclosure illustrated with a z-axis, and it may be called the vertical direction or the out-of-plane direction. It should be appreciated that the words "horizontal" and "vertical" refer in this disclosure only to a plane and to a direction which is perpendicular to that plane. They do not imply anything about how the device should be oriented with respect to Earth's gravitational field when the device is manufactured or used. The same also applies to terms which are related to "vertical", such as "above" and "below", or "up" and "down".

In some technical applications, the rotor may be designed and configured to undergo linear out-of-plane motion where the entire rotor moves out of the device plane. In other applications, the rotor may be designed to undergo rotational out-of-plane motion where it rotates about an axis which lies in the device plane. This disclosure presents motion limiters intended for limiting any kind of out-of-plane motion.

The exemplary aspects of this disclosure provide a microelectromechanical device comprising a mobile rotor and a fixed stator. The rotor lies in a horizontal device plane in its rest position. The rotor lies adjacent to the stator so that the edge of the rotor is separated from the edge of the stator by a rotor-stator gap.

The device further comprises a fixed wall. The fixed wall defines a wall plane that is adjacent to the horizontal device plane and separated from the horizontal device plane in a vertical direction by a rotor-wall gap. The vertical direction is perpendicular to the horizontal device plane.

The micromechanical device further comprises a motion limiter that is configured to prevent the rotor from coming into direct physical contact with the fixed wall across the rotor-wall gap. The motion limiter comprises a shock absorber that extends from the rotor to the stator across the rotor-stator gap. The shock absorber is flexible in the vertical direction. The motion limiter also comprises a fixed stopper structure that protrudes from the fixed wall in the vertical direction toward the shock absorber so that the stopper structure is vertically aligned with the shock absorber in an impact region. The shock absorber is separated from the stopper structure in the vertical direction by a stopper gap.

According to an exemplary aspect, the stopper structure is dimensioned so that when the mobile rotor undergoes motion in the vertical direction toward the fixed wall, the shock absorber comes into contact with the stopper structure in the impact region before the rotor comes into contact with the fixed wall across the rotor-wall gap.

The mobile rotor may in some applications be called a mass element, a proof mass or a Coriolis mass. The rotor is in its rest position when it is not undergoing movement with respect to the fixed structures. The rotor may be moved away from its rest position, and, for example, be set into oscillating movement, by a force transducer or the like. In addition to, or alternatively to, this deliberate actuation, the rotor may be moved away from its rest position by externally imposed movement. The motion limiter described in this disclosure may be configured to limit out-of-plane motion of any kind.

FIGS. 1a to 1d illustrate schematically the operation of the motion limiter in the microelectromechanical device according to an exemplary aspect. It is noted that the shapes and relative sizes of the elements and gaps illustrated in FIGS. 1a to 1d were selected only to illustrate the operating principle of the motion limiter. Many other shapes may alternatively be used, and the relative dimensions of the elements and the gaps may differ from these illustrations in alternative aspects.

As shown, the device comprises a mobile rotor 11 and a fixed stator 12. FIG. 1a illustrates the device when the rotor is in its rest position and the rotor lies in the device plane. The stator 12 is a fixed structure that remains fixed in the device plane even as the rotor 11 undergoes movement. The device comprises a shock absorber 13 that extends from the rotor 11 to the stator 12 in a motion limiter region in the device plane. The gap 181 between the edges of the rotor 11 and the stator 12 may be called the rotor-stator gap for purposes of this disclosure.

FIG. 1b illustrates the A-A cross-section from FIG. 1a. The device comprises a motion-limiter region 171 that may be coextensive with the shock absorber 13 in the device plane when the rotor is in its rest position.

FIGS. 1a and 1b also illustrate a fixed wall 14 and the rotor-wall gap 182. A fixed stopper structure 15 is attached to the fixed wall 14. The stopper structure may have a top surface 151 that is attached to the fixed wall and a bottom surface 152. The impact region 171 is the area where the stopper structure 15 and the shock absorber 13 will come into contact with each other in the impact region 171 when the rotor moves sufficiently far upward. In FIGS. 1a to 1d the impact region 171 is the area where the vertical projection of the bottom surface 152 of the stopper structure 15 overlaps with the shock absorber 13.

The wall plane corresponds in FIGS. 1a to 1d to the plane where the illustrated wall 14 is located. If the fixed wall has a more irregular shape, the wall plane may correspond to the horizontal plane which crosses the point where the stopper structure 15 is attached to the fixed wall.

The fixed wall 14 may, for example, be a surface on a support wafer that is adjacent to the device layer and provides mechanical support for the device layer on one or more edges (not illustrated) of the device. Alternatively, the fixed wall 14 may be a surface on a cap wafer that has been placed adjacent to the device layer, or an inside surface of any similar packaging structure. The fixed structures adjacent to the device layer typically form an enclosure around the rotor.

The shock absorber 13 is separated from the fixed stopper structure 15 by a stopper gap 183. To prevent direct contact between the rotor 11 and the vertically adjacent fixed wall 14 when the out-of-plane displacement of the rotor 11 approaches a given threshold value, the motion limiter is designed to bring the shock absorber 13 into contact with the stopper structure 15 across the stopper gap 183 before the rotor 11 can make contact with the fixed wall 14.

Figure 1C:
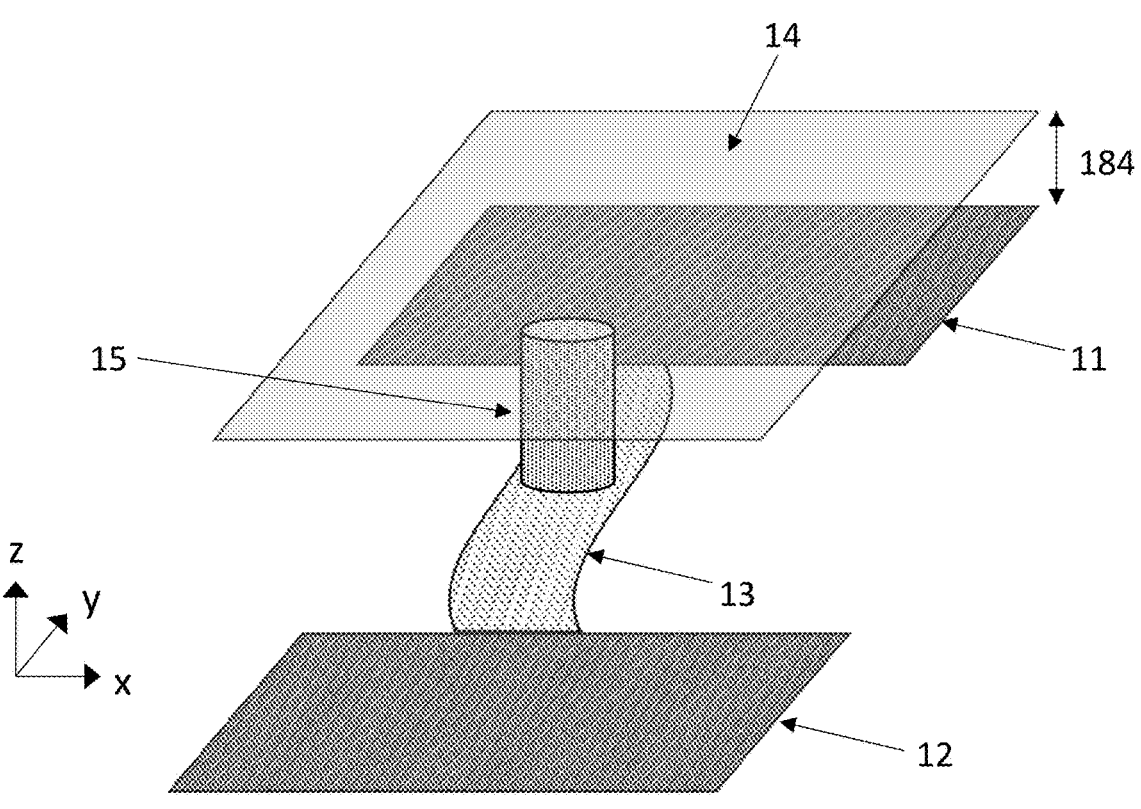
Figure 1D:
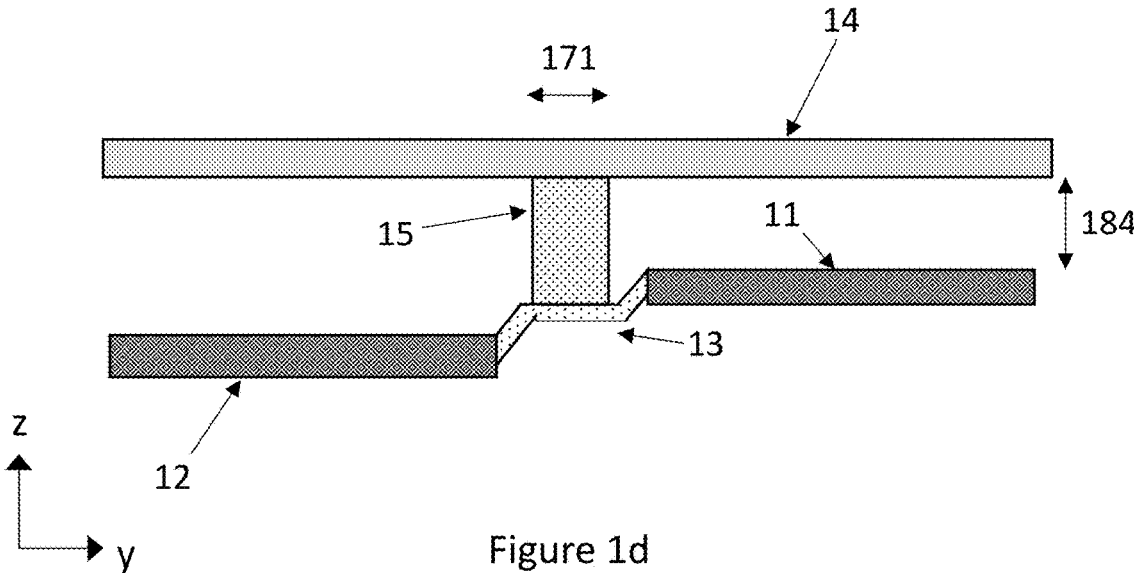

This is illustrated in FIGS. 1c and 1d, which show the device when the rotor 11 has moved away from its rest position. FIG. 1d shows the same cross-section as FIG. 1b. The shock absorber 13 is flexible in the vertical direction. At least some parts of the shock absorber 13 therefore bend when the rotor 11 moves in the out-of-plane direction. The stopper gap 183 has been dimensioned so that, if the rotor 11 moves sufficiently far in the out-of-plane direction, the shock absorber 13 comes into contact with the stopper structure 15 before the rotor 11 touches the fixed wall 14. In other words, there is a nonzero threshold gap 184 between the rotor 11 and the fixed wall 14 when the shock absorber 13 makes contact with the stopper structure 15, as FIGS. 1c and 1d illustrate.

Due to the placement of the shock absorber 13 and its vertical flexibility, the impact between the shock absorber 13 and the stopper structure 15 will be softer than the impact which would take place if the rotor 11 (or a bump located on the rotor) would strike the fixed wall 14.

In operation, the vertical impact velocity V1 at which the shock absorber 13 strikes the stopper structure 15 is less than the velocity V2 at which the rotor 11 moves toward the wall 14 at the moment of impact. The difference between V1 and V2 will depend on the vertical flexibility of the shock absorber 13. If the rotor undergoes rotational out-of-plane motion (instead of the linear out-of-plane translation illustrated in FIGS. 1c and 1d), the distance between the point where the shock absorber is attached to the rotor and the edge of the rotor which comes closest to the fixed wall will also influence the difference between V1 and V2.

In the figures of this disclosure, the impact region is typically placed somewhere near the middle of the rotor-stator gap. However, the impact region could alternatively be closer to the rotor than to the stator or closer to the stator than to the rotor. The threshold at which the impact occurs (i.e., the point where the rotor has moved so much upward that the gap between the rotor and the wall equals the threshold gap 184) is determined by the geometry of the shock absorber 13 in the xy-plane and its vertical flexibility and by the height of the stopper structure 15.

According to an exemplary aspect, the vertical flexibility of the shock absorber 13 allows the rotor 11 to move a little further upward even after the shock absorber 13 makes contact with the stopper structure 15 as shown in FIG. 1d. The motion limiter nevertheless begins to counteract the movement of the rotor 11 as soon as the contact occurs, so that the rotor gradually comes to a stop. The soft impact between the shock absorber 13 and the stopper structure 15 reduces the possibility of damage and particle debris.

In an exemplary aspect, the thickness of the shock absorber 13 in the vertical z-direction may be less than the vertical thickness of the rotor, as FIG. 1b illustrates. This can make the shock absorber vertically flexible. But vertical flexibility can also be achieved by other means.

Moreover, the shock absorber can, for example, comprise an impact part that is aligned with the stopper structure in the vertical direction, one or more first shock absorber springs that extend from the rotor to the impact part, and one or more second shock absorber springs that extend from the impact part to the stator. The one or more first shock absorber springs and the one or more second shock absorber springs may be flexible in the vertical direction.

In other words, the shock absorber can comprise an impact part which is designed to come into contact with the stopper structure. The impact part may be substantially rigid plate which does not have significant vertical flexibility in alternative exemplary aspects. The area of the impact part in the xy-plane may be substantially equal to or slightly larger than the area of the bottom surface 152 of the stopper structure 15. In addition to the impact part, the shock absorber may comprise springs to provide vertical flexibility to the shock absorber. The impact part and the springs may have the same vertical thickness as the rotor.

The vertically flexible springs on both sides of the impact part allow the force of the impact (e.g., between the stopper structure and the impact part) to be converted into a breaking force that slows down the movement of the rotor and eventually brings the rotor to a soft stop.

Figure 2A:
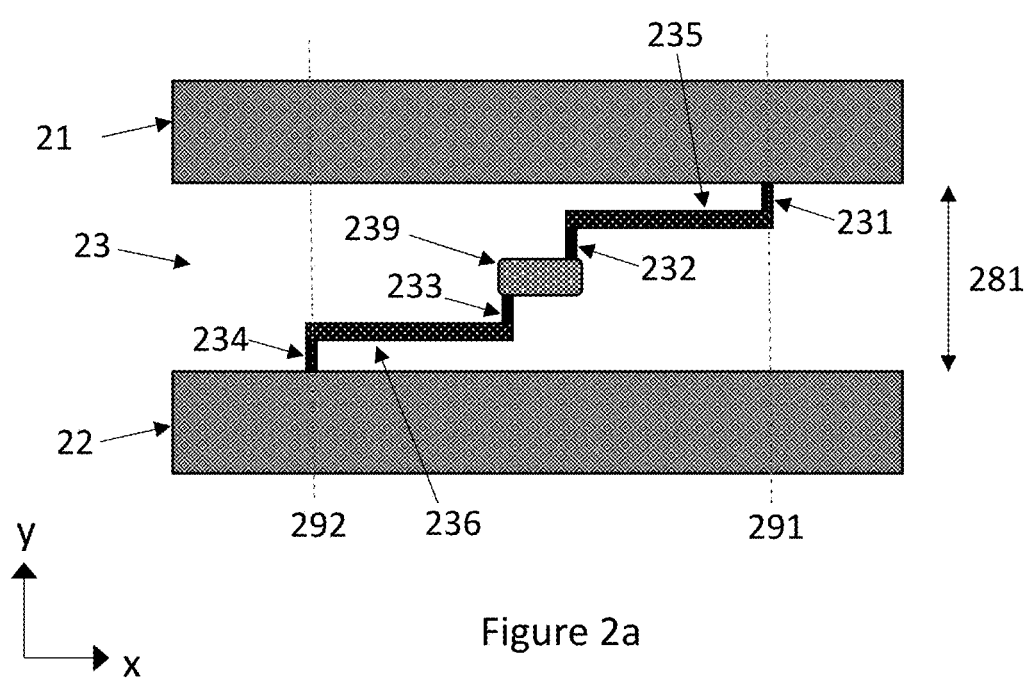
FIGS. 2a to 2b illustrate shock absorbers according to an exemplary aspect.
Figure 2B:
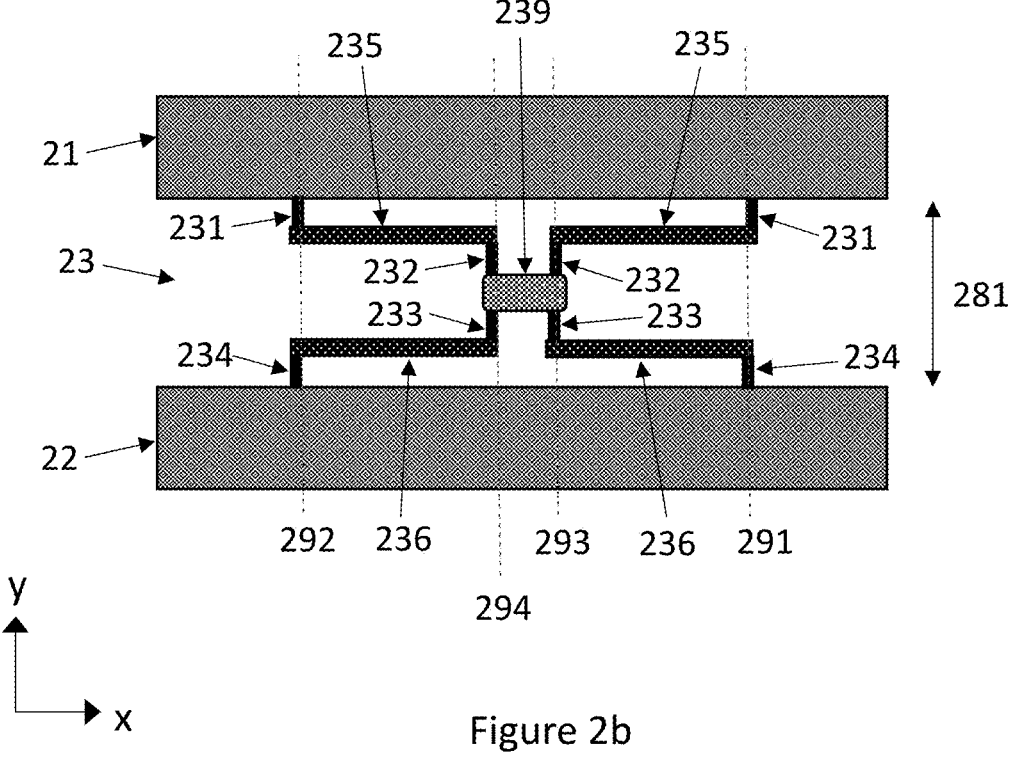

FIGS. 2a to 2b illustrate microelectromechanical devices where reference numbers 21, 22, 23 and 281 correspond to reference numbers 11, 12, 13 and 181, respectively, in FIG. 2a.

The one or more first shock absorber springs may include one first shock absorber spring, and the one or more second shock absorber springs may include one second shock absorber spring. In FIG. 2a, the shock absorber 23 comprises an impact part 239, a first shock absorber spring (231+235+ 232) and a second shock absorber spring (233+236+234).

Each shock absorber spring comprises two attachment sections and a connecting lever that extends between these attachment sections. The first shock absorber spring comprises a torsionally flexible first attachment section 231, which is attached to the edge of the rotor 21. The first attachment section 231 extends in the transversal direction toward the stator 22. The first shock absorber spring further comprises a torsionally flexible second attachment section 232, which is attached to the impact part 239 and extends in the transversal direction toward the rotor 21. The first shock absorber spring further comprises a first connecting lever 235, which extends from the first attachment section 231 to the second attachment section 232.

The second shock absorber spring comprises a torsionally flexible third attachment section 233, which is attached to the impact part 239 and extends in the transversal direction toward the stator 22. The second shock absorber spring further comprises a torsionally flexible fourth attachment section 234, which is attached to the stator 22 and extends in the transversal direction toward the rotor 21. The second shock absorber spring further comprises a second connecting lever 236, which extends from the third attachment section 233 to the fourth attachment section 234.

The torsional flexibility of the attachment sections 231-234 provides the shock absorber 23 with vertical flexibility. In other words, the attachment sections may twist around their lengthwise axes (for example, axis 291 for attachment section 231, or axis 292 for attachment section 234) when the rotor moves in the vertical direction. This configuration allows the connecting levers 235 and 236 to turn out of the device plane. The connecting levers 235-236 may optionally also bend in the vertical direction to provide further vertical flexibility to the shock absorber springs.

The torsionally flexible attachment sections described in this disclosure can, for example, be straight bars that have a narrow width in the x-direction, as FIG. 2a illustrates. Such bars may be called torsion bars. The first shock absorber spring may comprise a first torsion bar attached to the rotor, a second torsion bar attached to the impact part and a first connecting lever which extends between the first torsion bar and the second torsion bar, and the second shock absorber spring may comprise a third torsion bar attached to the impact part, a fourth torsion bar attached to the stator and a second connecting lever which extends between the third torsion bar and the fourth torsion bar.

In any of the exemplary embodiments of this disclosure, the dimensions of each first shock absorber spring may be substantially equal to the dimensions of each second shock absorber spring.

The number of first and second shock absorber springs can be increased as needed. The one or more first shock absorber springs may, for example, include two first shock absorber springs attached to opposite ends of the impact part, and the one or more second shock absorber springs may also include two second shock absorber springs attached to opposite ends of the impact part. This is illustrated in FIG. 2b, where each reference number refers to the same element as in FIG. 2a, but there are two first shock absorber springs and two second shock absorber springs. Each first attachment section 231 may be aligned with an opposing fourth attachment section 234 on a transversal axis (e.g., axis 291 or 292 in FIG. 2b). Correspondingly, each second attachment section 232 may be aligned with an opposing third attachment section 233 on a transversal axis (e.g., axis 293 or 294 in FIG. 2b).

As before, the torsionally flexible attachment sections may be torsion bars. Consequently, each of the two first absorbers springs in FIG. 2b may comprises a first torsion bar attached to the rotor, a second torsion bar attached to the impact part and a first connecting lever which extends between the first torsion bar and the second torsion bar. Each of the two second shock absorber springs may comprise a third torsion bar attached to the impact part, a fourth torsion bar attached to the stator and a second connecting lever which extends between the third torsion bar and the fourth torsion bar. The dimensions of each first shock absorber spring and each second shock absorber spring may be substantially equal.

Figure 3:
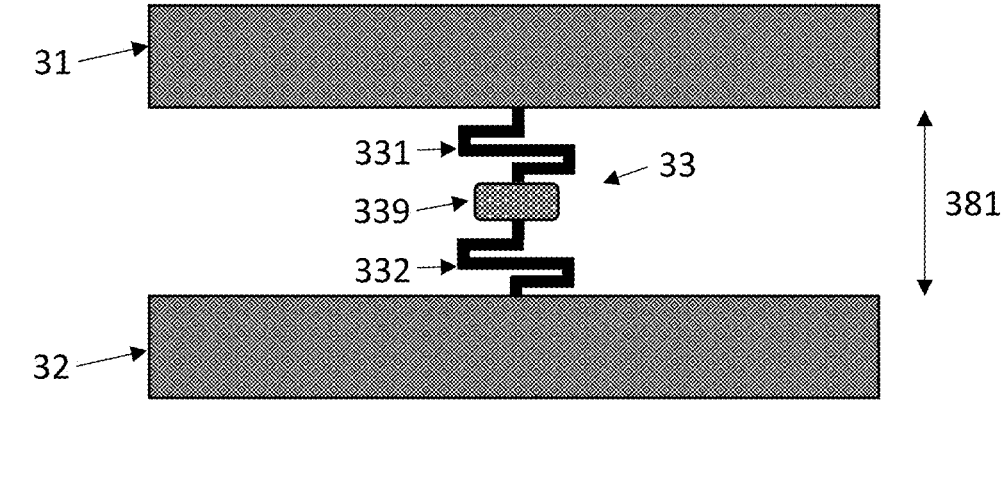
FIG. 3 illustrates a shock absorber according to another exemplary aspect.

The attachment sections or the entire shock absorber springs can alternatively be any other kind of vertically (and possibly torsionally) flexible structure which allows the rotor and the impact part to move out of the device plane. The one or more first shock absorber springs may, for example, include one first shock absorber spring that has a meandering shape in the device plane. Correspondingly, the one or more second shock absorber springs may include one second shock absorber spring that has a meandering shape in the device plane. This configuration is illustrated in FIG. 3, where reference numbers 31, 32, 33, 381 and 339 correspond to reference numbers 21, 22, 23, 281 and 239, respectively, in FIG. 2a. The first shock absorber spring 331 and the second shock absorber spring have a meandering shape which is flexible in the vertical direction.

Alternatively, two first shock absorber springs may extend from the rotor to the impact part, and both of them may have a meandering shape. Two second shock absorber springs may also extend from the stator to the impact part, and both of them may have a meandering shape.

In general, it is noted that the exemplary embodiments described above are intended to facilitate the understanding of the present invention, and are not intended to limit the interpretation of the present invention. The present invention may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above, and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

What is claimed:

1. A microelectromechanical device comprising:
a mobile rotor that lies in a horizontal device plane in a rest position;

a fixed stator adjacent to the mobile rotor, such that an edge of the mobile rotor is separated from an edge of the stator by a rotor-stator gap;

a fixed wall that defines a wall plane that is adjacent to the horizontal device plane and separated from the horizontal device plane in a vertical direction by a rotor-wall gap, with the vertical direction being perpendicular to the horizontal device plane; and a motion limiter that is configured to prevent the mobile rotor from coming into direct physical contact with the fixed wall across the rotor-wall gap, with the motion limiter including:

a shock absorber that extends from the mobile rotor to the fixed stator across the rotor-stator gap, and a fixed stopper structure that protrudes from the fixed wall in the vertical direction towards the shock absorber, so that fixed stopper structure is vertically aligned with the shock absorber in an impact region, and the shock absorber is separated from the fixed stopper structure in the vertical direction by a stopper gap, wherein the fixed stopper structure is dimensioned so that when the mobile rotor undergoes motion in the vertical direction towards the fixed wall, the shock absorber is configured to contact the fixed stopper structure in the impact region before the mobile rotor contacts the fixed wall across the rotor-wall gap, and wherein the shock absorber includes an impact part that is aligned with the fixed stopper structure in the vertical direction, one or more first shock absorber springs extending from the mobile rotor to the impact part, and one or more second shock absorber springs extending from the impact part to the fixed stator.

2. The microelectromechanical device according to claim 1, wherein the shock absorber is flexible in the vertical direction.

3. The microelectromechanical device according to claim 2, wherein the one or more first shock absorber springs and the one or more second shock absorber springs are flexible in the vertical direction.

4. The microelectromechanical device according to claim 1, wherein the one or more first shock absorber springs comprise a single first shock absorber spring, and the one or more second shock absorber springs comprise a single second shock absorber spring.

5. The microelectromechanical device according to claim 4, wherein the single first shock absorber spring comprises a first torsion bar attached to the mobile rotor, a second torsion bar attached to the impact part and a first connecting lever that extends between the first torsion bar and the second torsion bar.

6. The microelectromechanical device according to claim 5, wherein the single second shock absorber spring comprises a third torsion bar attached to the impact part, a fourth torsion bar attached to the fixed stator and a second connecting lever that extends between the third torsion bar and the fourth torsion bar.

7. The microelectromechanical device according to claim 4, wherein the single first shock absorber spring comprises a meandering shape in the device plane, and the single second shock absorber spring comprises a meandering shape in the device plane.

8. The microelectromechanical device according to claim 1, wherein the one or more first shock absorber springs comprises dimensions that are substantially equal to respective dimensions of the one or more second shock absorber springs.

9. The microelectromechanical device according to claim 1, wherein the one or more first shock absorber springs comprise a pair of first shock absorber springs attached to opposite ends of the impact part, and the one or more second shock absorber springs comprise a pair of second shock absorber springs attached to opposite ends of the impact part.

10. The microelectromechanical device according to claim 9, wherein each of the pair of first absorbers springs comprises a first torsion bar attached to the mobile rotor, a second torsion bar attached to the impact part and a first connecting lever extending between the first torsion bar and the second torsion bar.

11. The microelectromechanical device according to claim 10, wherein each of the pair of second shock absorber springs comprises a third torsion bar attached to the impact part, a fourth torsion bar attached to the fixed stator and a second connecting lever extending between the third torsion bar and the fourth torsion bar.

12. The microelectromechanical device according to claim 11, wherein each of the pair of first shock absorber spring and each of the pair of second shock absorber spring are substantially equal to one another, respectively.

13. The microelectromechanical device according to claim 1, wherein the shock absorber comprises a thickness in the vertical direction that is less than a thickness of the mobile rotor in the thickness direction.

14. The microelectromechanical device according to claim 1, wherein the microelectromechanical device is a gyroscope or an accelerometer.

15. A microelectromechanical device comprising:

a mobile rotor having a planar surface that extends in a horizontal device plane in a rest position;

a fixed stator having an edge that faces an edge of the mobile rotor with a rotor-stator gap separating the respective edges;

a fixed wall that is adjacent to the horizontal device plane and separated from the planar surface of the mobile rotor in a vertical direction by a rotor-wall gap, with the vertical direction being perpendicular to the horizontal device plane; and a motion limiter configured to prevent the mobile rotor from directly physical contacting the fixed wall across the rotor-wall gap, the motion limiter including:

a shock absorber that extends from the mobile rotor to the fixed stator across the rotor-stator gap, and a fixed stopper structure that protrudes from the fixed wall towards the shock absorber, so that fixed stopper structure is vertically aligned with the shock absorber in an impact region, wherein the fixed stopper structure is dimensioned so that when the mobile rotor undergoes motion in the vertical direction towards the fixed wall, the shock absorber is configured to contact the fixed stopper structure in the impact region before the mobile rotor contacts the fixed wall across the rotor-wall gap.

16. The microelectromechanical device according to claim 15, wherein the shock absorber includes an impact part that is aligned with the fixed stopper structure in the vertical direction, one or more first shock absorber springs extending from the mobile rotor to the impact part, and one or more second shock absorber springs extending from the impact part to the fixed stator.

17. The microelectromechanical device according to claim 15, wherein the shock absorber is flexible in the vertical direction, and wherein the one or more first shock absorber springs and the one or more second shock absorber springs are flexible in the vertical direction.

18. The microelectromechanical device according to claim 16, wherein the one or more first shock absorber springs comprise a single first shock absorber spring, and the one or more second shock absorber springs comprise a single second shock absorber spring.

19. The microelectromechanical device according to claim 18, wherein the single first shock absorber spring comprises a first torsion bar attached to the mobile rotor, a second torsion bar attached to the impact part and a first connecting lever that extends between the first torsion bar and the second torsion bar, and wherein the single second shock absorber spring comprises a third torsion bar attached to the impact part, a fourth torsion bar attached to the fixed stator and a second connecting lever that extends between the third torsion bar and the fourth torsion bar.

20. The microelectromechanical device according to claim 16, wherein the one or more first shock absorber springs comprises dimensions that are substantially equal to respective dimensions of the one or more second shock absorber springs.

21. The microelectromechanical device according to claim 20, wherein the one or more first shock absorber springs comprise a pair of first shock absorber springs attached to opposite ends of the impact part, and the one or more second shock absorber springs comprise a pair of second shock absorber springs attached to opposite ends of the impact part, wherein each of the pair of first absorbers springs comprises a first torsion bar attached to the mobile rotor, a second torsion bar attached to the impact part and a first connecting lever extending between the first torsion bar and the second torsion bar, wherein each of the pair of second shock absorber springs comprises a third torsion bar attached to the impact part, a fourth torsion bar attached to the fixed stator and a second connecting lever extending between the third torsion bar and the fourth torsion bar, and wherein each of the pair of first shock absorber spring and each of the pair of second shock absorber spring are substantially equal to one another, respectively.

22. The microelectromechanical device according to claim 15, wherein the microelectromechanical device is a gyroscope or an accelerometer.

\* \* \* \* \*